(12) United States Patent
Chen (10) Patent No.: US 8,958,233 B2
(45) Date of Patent: Feb. 17, 2015

(54) STABILIZATION OF RESISTIVE MEMORY (75) Inventor: Xiaonan Chen, Boise, ID (US)

(73) Assignee: Micron Technology, Inc., Boise, ID (US)

(*) Notice: Subject to any disclaimer, the term of this patent is extended or adjusted under 35 U.S.C. 154(b) by 749 days.

(21) Appl. No.: 13/275,901

(22) Filed: Oct. 18, 2011

(65) Prior Publication Data
US 2013/0094275 A1 Apr. 18, 2013

(51) Int. Cl.
*G11C 11/00* (2006.01)

(52) U.S. Cl.
CPC ..................................... *G11C 11/00* (2013.01)
USPC .................. 365/148; 365/185.19; 365/185.22

(58) Field of Classification Search
CPC ........... G11C 13/0069; G11C 11/5678; G11C 13/0064; G11C 2213/72
USPC ................................ 365/148, 185.19, 185.22
See application file for complete search history.

(56) References Cited

U.S. PATENT DOCUMENTS

| 5,541,869 | A | 7/1996 | Rose et al. | |
|---|---|---|---|---|
| 6,344,991 | B1 | 2/2002 | Mikami et al. | |
| 6,930,909 | B2 | 8/2005 | Moore et al. | |
| 7,433,222 | B2 * | 10/2008 | Hosoi et al. .................... | 365/148 |
| 7,463,506 | B2 | 12/2008 | Muraoka et al. | |
| 7,499,304 | B2 * | 3/2009 | Scheuerlein et al. ......... | 365/148 |
| 7,558,105 | B2 * | 7/2009 | Suh ............................... | 365/163 |
| 7,639,522 | B2 | 12/2009 | Cho et al. | |
| 7,778,066 | B2 | 8/2010 | Horii et al. | |
| 7,778,079 | B2 | 8/2010 | Jeong et al. | |
| 7,796,424 | B2 | 9/2010 | Happ et al. | |
| 7,800,935 | B2 | 9/2010 | Maejima et al. | |
| 7,826,248 | B2 | 11/2010 | Xi et al. | |
| 7,835,173 | B2 | 11/2010 | Ma et al. | |
| 7,885,121 | B2 | 2/2011 | Takase | |
| 8,144,525 | B2 * | 3/2012 | Macerola et al. ......... | 365/189.15 |
| 8,194,433 | B2 * | 6/2012 | Parkinson ..................... | 365/148 |
| 8,355,271 | B2 * | 1/2013 | Rabkin et al. ................. | 365/148 |
| 8,462,580 | B2 * | 6/2013 | Rabkin et al. ................. | 365/243 |
| 2007/0195581 | A1 | 8/2007 | Morimoto | |
| 2009/0109737 | A1 | 4/2009 | Kostylev | |
| 2010/0008165 | A1 * | 1/2010 | Macerola et al. ......... | 365/189.15 |
| 2010/0237317 | A1 | 9/2010 | Tsunoda | |
| 2010/0284211 | A1 * | 11/2010 | Hennessey .................... | 365/163 |

(Continued)

FOREIGN PATENT DOCUMENTS

JP 2007004873 1/2007
WO 2005059921 6/2005

(Continued)

OTHER PUBLICATIONS

Office Action for related Korean Patent Application No. 10-2014-7012898, dated Jun. 17, 2014, 8 pages.

(Continued)

*Primary Examiner* — Tuan T Nguyen
(74) *Attorney, Agent, or Firm* — Brooks, Cameron & Huebsch, PLLC (57) ABSTRACT

The present disclosure includes apparatuses and methods including stabilization of resistive memory. A number of embodiments include applying a programming signal to a resistive memory cell, wherein the programming signal includes a first portion having a first polarity and a second portion having a second polarity, wherein the second polarity is opposite the first polarity.

32 Claims, 5 Drawing Sheets

(56) References Cited

U.S. PATENT DOCUMENTS

| | | | |
|---|---|---|---|
| 2010/0284212 | A1 | 11/2010 | Bedeschi et al. |
| 2011/0019462 | A1 | 1/2011 | Toda |
| 2011/0026300 | A1 | 2/2011 | Ogata |
| 2011/0069539 | A1 | 3/2011 | Eleftheriou et al. |
| 2011/0128773 | A1 | 6/2011 | Zauma et al. |
| 2011/0176351 | A1 | 7/2011 | Fujitsuka et al. |
| 2013/0044534 | A1 | 2/2013 | Kawai et al. |
| 2013/0223131 | A1 | 8/2013 | Takagi et al. |
| 2013/0242642 | A1 | 9/2013 | Katayama et al. |
| 2014/0233299 | A1* | 8/2014 | Lan et al. ............ 365/148 |

FOREIGN PATENT DOCUMENTS

| | | |
|---|---|---|
| WO | 2009145308 | 12/2009 |
| WO | 2011121970 | 10/2011 |
| WO | 2012067737 | 5/2012 |
| WO | 2012172773 | 12/2012 |
| WO | 2013021649 | 2/2013 |

OTHER PUBLICATIONS

Examination Report for related Great Britain Patent Application No. GB1406753.2, dated May 13, 2014, 3 pages.

U.S. Appl. No. 13/276,053, filed Oct. 18, 2011 by Alessandro Torsi (29 pp.).

International Search Report and Written Opinion for related PCT Application No. PCT/US2012/059543, mailed Jan. 30, 2013, (11 pgs.).

Second Examination Report for related Great Britain Patent No. GB1406753.2, dated Aug. 7, 2014, 3 pages.

Aratani, K. et al. "A Novel Resistance Memory with High Scalability and Nanosecond Switching", IEEE International Electron Devices Meeting 2007, pp. 783-786, Dec. 10-12, 2007.

Chen, Y.S. et al. "Highly Scalable Hafnium Oxide Memory with Improvements of Resistive Distribution and Read Disturb Immunity", IEEE International Electron Devices Meeting 2009, pp. 5.5.1-5.5.4, Dec. 7-9, 2009.

Chen, Yu-Sheng et al. "Forming-free HfO2 Bipolar RRAM Device with Improved Endurance and High Speed Operation", VLSI Technology, Systems, and Applications 2009, pp. 37-38, Apr. 27-29, 2009.

Choi, Hyejung et al. "An electrically modifiable synapse array of resistive switching memory", Nanotechnology, vol. 20, 345201, 5 pp., Aug. 4, 2009.

Choi, Sang-Jun et al. "Multibit Operation of Cu/Cu—GeTe/W Resistive Memory Device Controlled by Pulse Voltage Magnitude and Width", IEEE Electron Device Letters, vol. 32, No. 3, pp. 375-377, Mar. 2011.

Gao, Bin et al. "Modeling of Retention Failure Behavior in Bipolar Oxide-Based Resistive Switching Memory", IEEE Electron Device Letters, vol. 32, No. 3, pp. 276-278, Mar. 2011.

Fang, Z. et al. "Temperature Instability of Resistive Switching on HfOx-based RRAM Devices", IEEE Electron Device Letters, vol. 31, No. 5, pp. 476-478, May 2010.

Kund, Michael et al. "Conductive bridging RAM (CBRAM): An emerging non-volatile memory technology scalable to sub 20nm", IEEE International Electron Devices Meeting 2005, pp. 754-757, Dec. 5, 2005.

Lee, H.Y. et al. "Low Power and High Speed Bipolar Switching with a Thin Reactive Ti Buffer Layer in Robust HfO2 Based RRAM", IEEE International Electron Devices Meeting 2008, pp. 1-4, Dec. 15-17, 2008.

Liaw, Corvin et al. "The Conductive Bridging Random Access Memory (CBRAM): A Non-Volatile Multi-Level Memory Technology", ESSDERC Solid State Device Research Conference 2007, pp. 226-229, Sep. 11-13, 2007.

Liu, Chih-Yi et al. "Resistance switching properties of sol-gel derived SrZrO3 based memory thin films", Journal of Physics D: Applied Physics, vol. 40, pp. 2157-2161, Mar. 16, 2007.

Rahaman, S.Z. et al. "Low Current and Voltage Resistive Switching Memory Device Using Novel Cu/Ta2O5/W Structure", VLSI Technology, Systems, and Applications 2009, pp. 33-34, Apr. 27-29, 2009.

Soni, R. et al. "Reliability analysis of the low resistance state stability of Ge0.3Se0.7 based solid electrolyte nonvolatile memory cells", Applied Physics Letters, vol. 94, 123503, 3 pp., Mar. 26, 2009.

Waser, R. et al. "Redox-Based Resistive Switching Memories-Nanoionic Mechanisms, Prospects, and Challenges", Advanced Materials, vol. 21, No. 25-26, pp. 2632-2663, Jul. 13, 2009.

Yu, Shimeng et al. "Investigating the switching dynamics and multilevel capability of bipolar metal oxide resistive switching memory", Applied Physics Letters, vol. 98, 103514, 3 pp., Mar. 11, 2011.

Zhang, Wangyuan et al. "Helmet: A Resistance Drift Resilient Architecture for Multi-level Cell Phase Change Memory System", IEEE/IFIP 41st International Conference on Dependable Systems & Networks 2011, pp. 197-208, Jun. 27-30, 2011.

Examination Report for related Great Britain Patent Application No. GB1406753.2, dated Oct. 9, 2014, 3 pages.

* cited by examiner

STABILIZATION OF RESISTIVE MEMORY

TECHNICAL FIELD

The present disclosure relates generally to semiconductor memory apparatuses and methods, and more particularly, to stabilization of resistive memory.

BACKGROUND

Memory devices are typically provided as internal, semiconductor, integrated circuits and/or external removable devices in computers or other electronic devices. There are many different types of memory including random-access memory (RAM), read only memory (ROM), dynamic random access memory (DRAM), synchronous dynamic random access memory (SDRAM), flash memory, and resistive (e.g., resistance variable) memory, among others. Types of resistive memory include programmable conductor memory, phase change random access memory (PCRAM), resistive random access memory (RRAM), magnetoresistive random access memory (MRAM; also referred to as magnetic random access memory), and conductive-bridging random access memory (CBRAM), among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), personal digital assistants (PDAs), digital cameras, cellular telephones, portable music players (e.g., MP3 players) and movie players, among other electronic devices. Data, such as program code, user data, and/or system data, such as a basic input/output system (BIOS), are typically stored in non-volatile memory devices.

Resistive memory such as RRAM includes resistive memory cells that can store data based on the resistance state of a storage element (e.g., a resistive memory element having a variable resistance). As such, resistive memory cells can be programmed to store data corresponding to a desired state by varying the resistance level of the resistive memory element. Resistive memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the resistive memory element of the cells) for a particular duration.

One of a number of programmed states (e.g., resistance states) can be set for a resistive memory cell. For example, a single level cell (SLC) may be programmed to one of two data states (e.g., logic 1 or 0), which can depend on whether the cell is programmed to a resistance above or below a particular level. As an additional example, various resistive memory cells can be programmed to one of multiple different resistance states corresponding to multiple data states. Such cells may be referred to as multi state cells, multi-digit cells, and/or multilevel cells (MLCs), and can represent multiple binary digits of data (e.g., 10, 01, 00, 11, 111, 101, 100, 1010, 1111, 0101, 0001, etc.).

The data state of a resistive memory cell can be determined (e.g., read) by sensing current through the cell responsive to an applied interrogation voltage. The sensed current, which varies based on the resistance level of the cell, can indicate the data state of the cell. However, in previous resistive memory approaches (e.g., previous MLC resistive memory approaches), as a resistive memory cell undergoes sensing over time and/or disturb from programming and/or erase operations on adjacent cells, the resistance level of the cell (e.g., of the resistance memory element of the cell) may shift due to, for example, the formation of a weak conductive filament in the resistance memory element. Such a resistance shift can result in a drift of the sensed (e.g., read) current through the cell, which can result in an erroneous determination of the data state of the cell. For example, the sensed current drift can result in a determination that the cell is in a data state other than the target data state to which the cell was programmed.

DETAILED DESCRIPTION

The present disclosure includes apparatuses and methods including stabilization of resistive memory. A number of embodiments include applying a programming signal to a resistive memory cell, wherein the programming signal includes a first portion having a first polarity and a second portion having a second polarity, wherein the second polarity is opposite the first polarity.

A number of embodiments of the present disclosure can stabilize the programmed resistance state of a resistive memory cell such that the cell may not experience a, or may experience a reduced, sensed (e.g., read) current drift after a number of read operations, as in some prior approaches. For example, a number of embodiments of the present disclosure can reduce and/or prevent the formation of weak conductive filaments associated with the cell. As such, embodiments of the present disclosure can provide benefits such as increased accuracy and/or reliability (e.g., decreased error rate), and/or increased memory life, among other benefits.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more such things. For example, a number of memory cells can refer to one or more memory cells. Additionally, the designators "M" and "N" as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 100 may reference element "00" in FIG. 1, and a similar element may be referenced as 600 in FIG. 6. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

Figure 1:
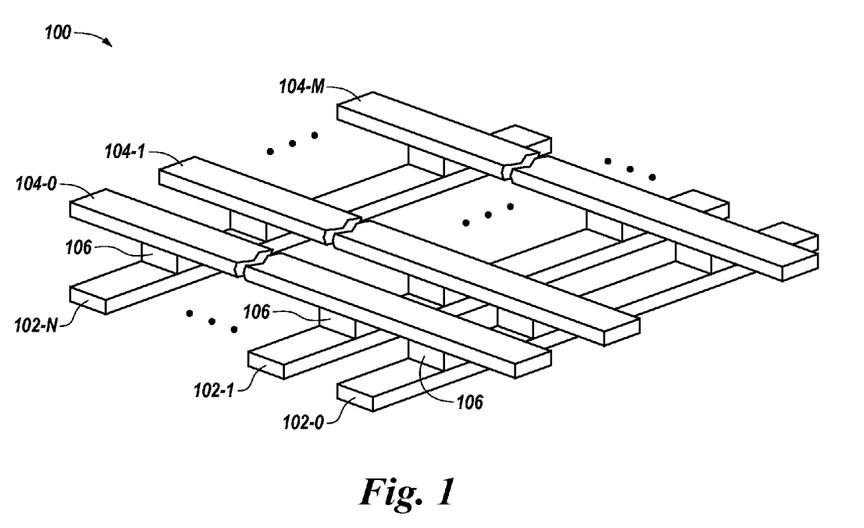
FIG. 1 is a block diagram of a portion of an array of resistive memory cells in accordance with one or more embodiments of the present disclosure.

FIG. 1 is a block diagram of a portion of an array 100 of resistive memory cells 106 in accordance with one or more embodiments of the present disclosure. In the example illustrated in FIG. 1, array 100 is a cross-point array having resistive memory cells 106 located at the intersections of a first number of conductive lines 102-0, 102-1, . . . , 102-N (e.g., access lines, which may be referred to herein as word lines), and a second number of conductive lines 104-0, 104-1, . . . , 104-M (e.g., data/sense lines, which may be referred to herein as bit lines). As illustrated in FIG. 1, word lines 102-0, 102-1, . . . , 102-N are substantially parallel to each other and are substantially orthogonal to bit lines 104-0, 104-1, . . . , 104-M, which are substantially parallel to each other; however, embodiments are not so limited. In the embodiment illustrated in FIG. 1, resistive memory cells 106 can function in a two-terminal architecture (e.g., with a particular word line 102-0, 102-1, . . . , 102-N and bit line 104-0, 104-1, . . . , 104-M serving as a bottom and top electrode for the cell).

Each resistive memory cell 106 can include a storage element (e.g., a resistive memory element) coupled (e.g., in series) to a select device (e.g., an access device). The access device can be, for example, a diode or a transistor (e.g., a field effect transistor (FET) or bipolar junction transistor (BJT)), among others. The storage element can include a programmable portion that may have a variable resistance, for example. For instance, the storage element can include one or more resistance variable materials (e.g., a material programmable to multiple different resistance states, which can represent multiple different data states) such as, for example, a transition metal oxide material or a perovskite including two or more metals (e.g., transition metals, alkaline earth metals, and/or rare earth metals). Other examples of resistance variable materials that can be included in the storage element of resistive memory cells 106 can include various materials employing trapped charges to modify or alter conductivity, chalcogenides formed of various doped or undoped materials, binary metal oxide materials, colossal magnetoresistive materials, and/or various polymer based resistive variable materials, among others. Embodiments are not limited to a particular resistance variable material or materials. As such, resistive memory cells 106 can be single level and/or multi-level resistive random access memory (RRAM) cells, programmable conductor memory cells, phase change random access memory (PCRAM) cells, magnetoresistive random access memory cells, and/or conductive-bridging random access memory (CBRAM) cells, among various other types of resistive memory cells.

In operation, resistive memory cells 106 of array 100 can be programmed via programming signals (e.g., write voltage and/or current pulses) applied to the cells (e.g., the storage element of the cells) via selected word lines 102-0, 102-1, . . . , 102-N and bit lines 104-0, 104-1, . . . , 104-M. The amplitude (e.g., magnitude), duration (e.g., width), and/or number of programming pulses, for example, applied to resistive memory cells 106 can be adjusted (e.g., varied) in order to program the cells to one of a number of different resistance states corresponding to particular data states. Programming pulses in accordance with one or more embodiments of the present disclosure will be further described herein (e.g., in connection with FIGS. 3-6).

A sensing (e.g., program verify and/or read) operation can be used to determine the data state of a resistive memory cell 106 (e.g., the resistance state of the storage element of a resistive memory cell 106) by a magnitude of sensing (e.g., read) current, for example, on a bit line 104-0, 104-1, . . . , 104-M corresponding to the respective cell responsive to a particular voltage applied to the selected word line 102-0, 102-1, . . . , 102-N to which the selected cell is coupled. Sensing operations can also include biasing unselected word lines and bit lines at particular voltages in order to determine the data state of the selected cell. Sensing (e.g., program verify) pulses in accordance with one or more embodiments of the present disclosure will be further described herein.

Figure 2A:
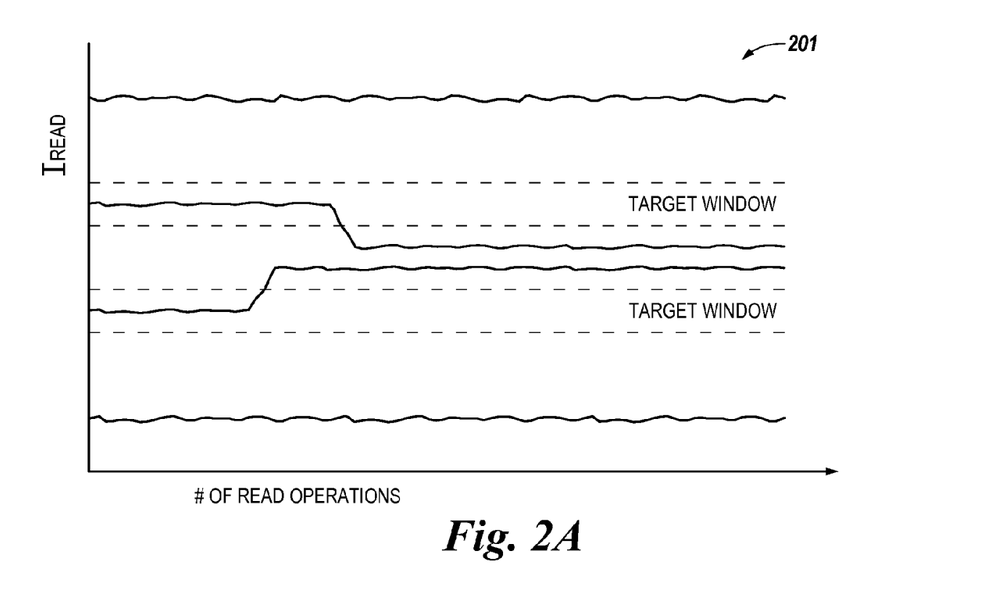
FIG. 2A is a graph illustrating read currents associated with resistive memory cells programmed in accordance with prior approaches.

FIG. 2A is a graph 201 illustrating read currents associated with resistive memory cells programmed in accordance with prior approaches. In the example shown in FIG. 2A, the resistive memory cells have been programmed to one of four different states (e.g., a high resistance state, a low resistance state, and two different intermediate resistance states within two different respective target windows between the high and low resistance states) in accordance with previous approaches.

As shown in FIG. 2A, after a particular number of read operations are performed on the resistive memory cells programmed to the intermediate states in accordance with previous approaches, these cells may exhibit read current drift (e.g., the read current associated with these cells may move outside the target windows of the cells). The read current drift may result from, for example, a shift in the resistance level (e.g., a change from the programmed resistance level) of these cells due to, for instance, read disturb and/or the formation of weak conductive filaments in the cells, among other causes. As a result of the read current drift, read operations performed on these cells may result in erroneous determinations of the data state of the cells (e.g., determinations that the cells are in a data state other than the target data state to which the cells were programmed).

Figure 2B:
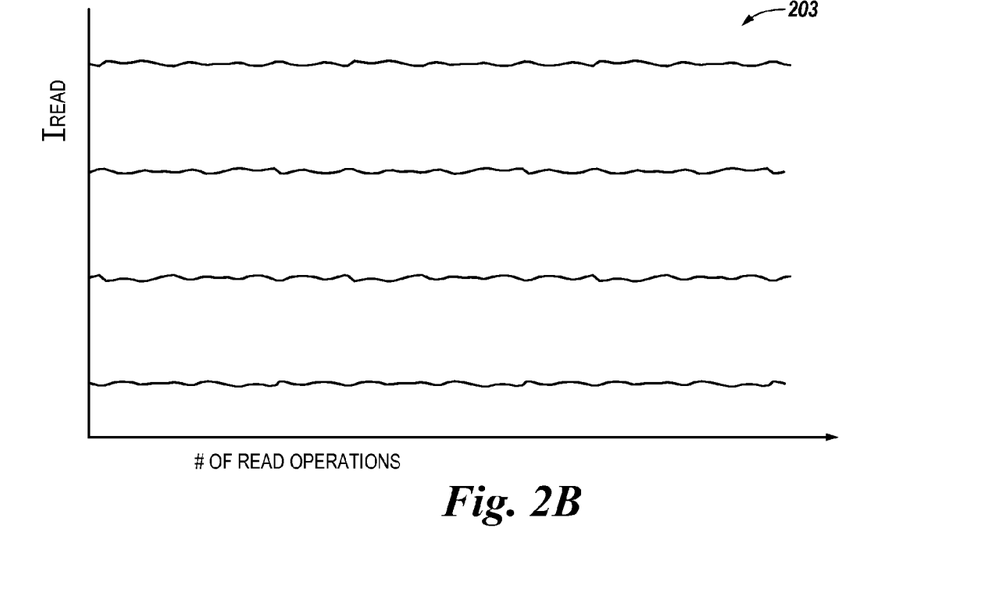
FIG. 2B is a graph illustrating read currents associated with resistive memory cells programmed in accordance with one or more embodiments of the present disclosure.

FIG. 2B is a graph 203 illustrating read currents associated with resistive memory cells programmed in accordance with one or more embodiments of the present disclosure. In the example shown in FIG. 2B, the resistive memory cells have been programmed to one of four data different states (e.g., a high resistance state, a low resistance state, and two different intermediate resistance states) in accordance with one or more embodiments of the present disclosure (e.g., using one or more of the programming signals further described herein).

As shown in FIG. 2B, the resistive memory cells programmed in accordance with one or more embodiments of the present disclosure do not exhibit or exhibit reduced read current drift (e.g., the read current associated with the cells remains within the target window of the cells) as read operations are performed on the cells. For example, the cells may not undergo read disturb and/or the formation of weak conductive filaments in the cells, which can reduce and/or prevent a shift in the resistance level of the cells. Because the cells do not exhibit read current drift, or exhibit reduced read current drift, the cells may have increased accuracy, reliability, and/or cell life, among other benefits.

Figure 3:
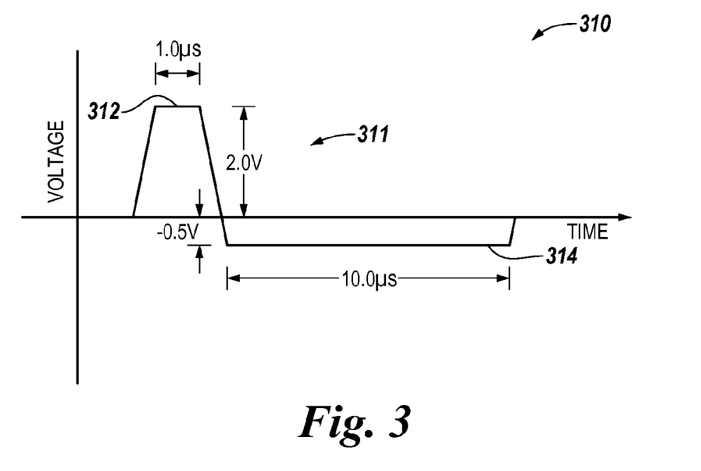
FIG. 3 illustrates a timing diagram associated with operating resistive memory cells in accordance with one or more embodiments of the present disclosure.

FIG. 3 illustrates a timing diagram 310 associated with operating resistive memory cells in accordance with one or more embodiments of the present disclosure. Timing diagram 310 includes a programming signal 311. In this example, programming signal 311 includes pulses 312 and 314. As an example, programming signal 311 can be used in association with programming resistive memory cells such as resistive memory cells 106 of array 100 previously described in connection with FIG. 1.

Programming pulses 312 and 314 can be applied to a selected resistive memory cell in order to program the cell to a resistance state corresponding to a target data state. In this example, pulse 312 of signal 311 has a positive polarity (e.g., pulse 312 is a positive pulse), an amplitude of approximately 2.0 Volts (V), and a duration (e.g., width) of approximately 1.0 microseconds (μs). However, embodiments of the present disclosure are not limited to a particular amplitude or duration for pulse 312, which can be referred to as a programming pulse 312. As an example, pulse 312 can be a set programming pulse (e.g., a pulse used to program a cell from a high resistance reset state to one of a number of lower resistance states between the reset state and a low resistance set state).

Programming signal 311 includes pulse 314, which can be referred to as a stabilization pulse 314. In the embodiment illustrated in FIG. 3, stabilization pulse 314 is applied to the selected resistive memory cell immediately after programming pulse 312 is applied to the cell. That is, programming pulse 312 and stabilization pulse 314 can be applied to the selected resistive memory cell as a combined pulse.

As shown in FIG. 3, the polarity of stabilization pulse 314 is opposite the polarity of programming pulse 312 (e.g., stabilization pulse 314 is a negative pulse). As an example, stabilization pulse 314 can have an amplitude of approximately $-0.5$ V and a duration of approximately 10.0 μs, as illustrated in FIG. 3. That is, stabilization pulse 314 can have a smaller amplitude and/or a longer duration than programming pulse 312. However, embodiments of the present disclosure are not limited to a particular amplitude or duration for stabilization pulse 314. In a number of embodiments, the amplitude and duration of stabilization pulse 314 can depend on factors such as the type of resistive memory cell, among other factors. As an example, in a number of embodiments, the amplitude of stabilization pulse 314 can be increased as the duration of stabilization pulse 314 is decreased, and vice versa.

Applying stabilization pulse 314 to the selected resistive memory cell can provide stabilization of the programmed resistance state of the cell. For example, applying stabilization pulse 314 to the selected resistive memory cell can reduce and/or prevent a shift of the resistance level (e.g., a change from the programmed target resistance state) of the cell due to read disturb, for example. For instance, as previously described in connection with FIG. 2A, various resistive memory cells can exhibit read current drift after a particular number of read operations performed on the cell. A number of embodiments of the present disclosure that include application of a stabilization pulse such as pulse 314 can provide benefits such as reducing the read current drift associated with read operations, which can increase the accuracy and/or reliability (e.g., decrease the error rate), of resistive memory cells, among other benefits.

In a number of embodiments, signal 311 can include a program verify pulse (not shown in FIG. 3) used to determine whether the selected resistive memory cell has reached the target state. If not, a subsequent programming pulse and/or stabilization pulse can be applied to the selected resistive memory cell, followed by another program verify pulse, until the cell reaches the target state.

Although voltage pulses are shown in FIG. 3, embodiments of the present disclosure are not so limited. For example, programming signal 311 could include current pulses.

Figure 4:
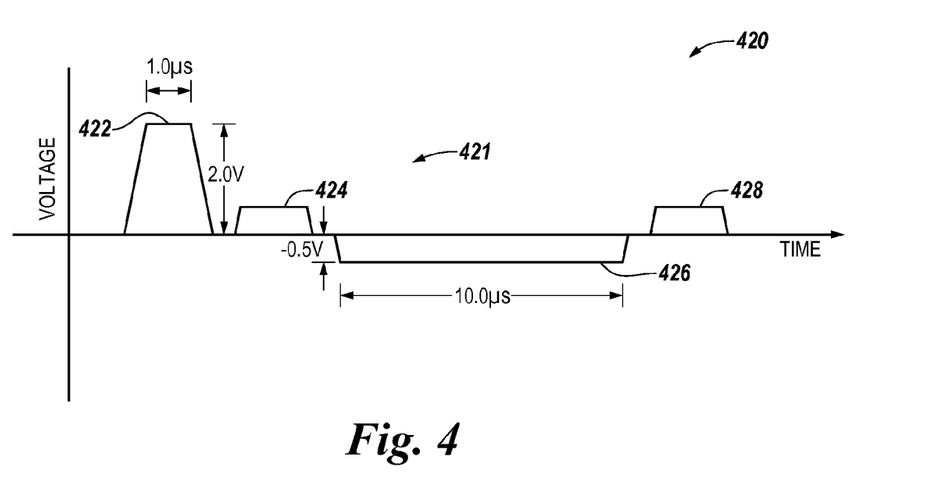
FIG. 4 illustrates a timing diagram associated with operating resistive memory cells in accordance with one or more embodiments of the present disclosure.

FIG. 4 illustrates a timing diagram 420 associated with operating resistive memory cells in accordance with one or more embodiments of the present disclosure. Timing diagram 420 includes a programming signal 411. In this example, programming signal 411 includes pulses 422, 424, 426, and 428. As an example, programming signal 411 can be used in association with programming resistive memory cells such as resistive memory cells 106 of array 100 previously described in connection with FIG. 1.

Programming pulses 422, 424, 426, and 428 can be applied to a selected resistive memory cell in order to program the cell to a resistance state corresponding to a target data state. In this example, pulse 422 of signal 421 can be analogous to programming pulse 312 previously described in connection with FIG. 3.

Programming signal 421 includes pulse 424, which can be referred to as a program verify pulse 424. In the embodiment illustrated in FIG. 4, program verify pulse 424 is applied to the selected resistive memory cell after programming pulse 422 is applied to the cell.

As shown in FIG. 4, as an example, program verify pulse 424 can have a smaller amplitude and/or a longer duration than programming pulse 422. However, embodiments of the present disclosure are not limited to a particular amplitude or duration for program verify pulse 424.

Program verify pulse 424 can be used to determine whether the selected resistive memory cell has reached the target state. If not, a subsequent programming pulse can be applied to the selected resistive memory cell, and followed by another program verify pulse, until the cell reaches the target state.

Programming signal 421 includes pulse 426, which can be referred to as a stabilization pulse 426. In the embodiment illustrated in FIG. 4, stabilization pulse 426 is applied to the selected resistive memory cell after program verify pulse 424 is applied to the cell. That is, programming pulse 422 and stabilization pulse 426 can be applied to the selected resistive memory cell as separate pulses.

Stabilization pulse 426 can be analogous to stabilization pulse 314 previously described in connection with FIG. 3. Applying stabilization pulse 426 to the selected resistive memory cell can provide stabilization of the programmed resistance state of the cell, in a manner analogous to that previously described in connection with FIG. 3.

Programming signal 421 includes pulse 428, which can be referred to as a program verify pulse 428. In the embodiment illustrated in FIG. 4, program verify pulse 428 is applied to the selected resistive memory cell after stabilization pulse 426 is applied to the cell.

As shown in FIG. 4, the polarity of program verify pulse 428 is the same as the polarity of program verify pulse 424 (e.g., program verify pulse 428 is a positive pulse). As an example, program verify pulse 428 can have a smaller amplitude and/or a longer duration than programming pulse 422, as illustrated in FIG. 4 (e.g., program verify pulse 428 can have the same amplitude and/or duration as program verify pulse 424). However, embodiments of the present disclosure are not limited to a particular amplitude or duration for program verify pulse 428.

Program verify pulse 428 can be used to determine whether the selected resistive memory cell has remained in the target state. For example, program verify pulse 428 can be used to determine whether the resistance state of the cell has switched from the target resistance state (e.g., from a low resistance state to a high resistance state).

If the selected resistive memory cell has not remained in the target state (e.g., if the resistance state of the cell has switched from a low state to a high state), the programmed resistance state of the cell may not be stabilized. In such instances, an additional programming pulse and an additional stabilization pulse can be applied to the cell (e.g., after program verify pulse 428 is applied to the cell) to program and stabilize the cell again. The polarity of the additional stabilization pulse (not shown in FIG. 4) can be the same as the polarity of stabilization pulse 426 (e.g., the additional stabilization pulse can be a negative pulse). As an example, the additional stabilization pulse can have a different amplitude and/or a different duration than stabilization pulse 426.

If the selected resistive memory cell has remained in the target state (e.g., if the resistance state of the cell has not switched), the programmed resistance state of the cell may be stabilized. In such instances, it may be unnecessary to apply an additional stabilization pulse to the cell (e.g., no additional stabilization pulse may be applied to the cell).

Although voltage pulses are shown in FIG. 4, embodiments of the present disclosure are not so limited. For example, programming signal 421 could include current pulses.

Figure 5:
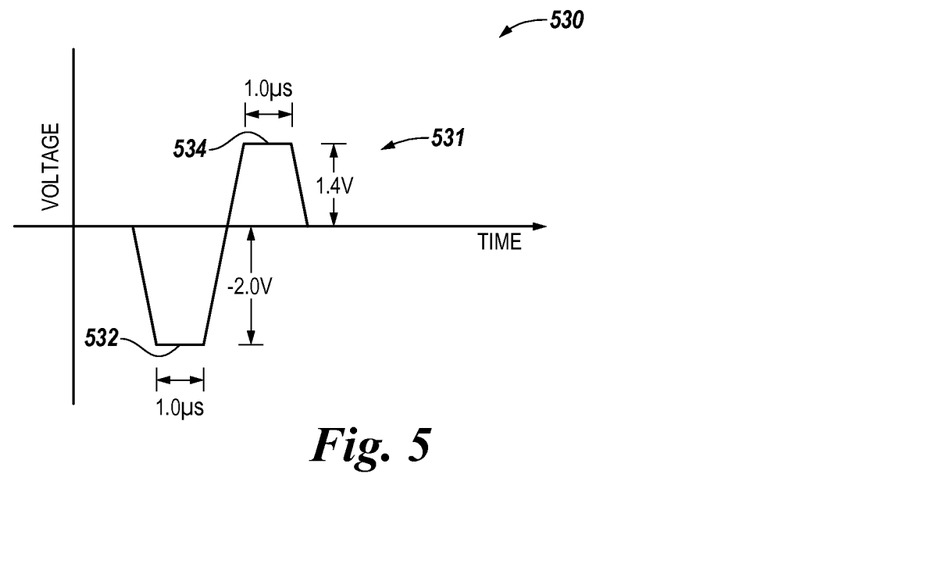
FIG. 5 illustrates a timing diagram associated with operating resistive memory cells in accordance with one or more embodiments of the present disclosure.

FIG. 5 illustrates a timing diagram 530 associated with operating resistive memory cells in accordance with one or more embodiments of the present disclosure. Timing diagram 530 includes a programming signal 531. In this example, programming signal 531 includes pulses 532 and 534. As an example, programming signal 531 can be used in association with programming resistive memory cells such as resistive memory cells 106 of array 100 previously described in connection with FIG. 1.

Programming pulses 532 and 534 can be applied to a selected resistive memory cell in order to program the cell to a resistance state corresponding to a target data state. In this example, pulse 532 of signal 531 has a negative polarity (e.g., pulse 532 is a negative pulse), an amplitude of approximately −2.0 Volts (V), and a duration (e.g., width) of approximately 1.0 microseconds (μd). However, embodiments of the present disclosure are not limited to a particular amplitude or duration for pulse 312. For example, pulse 532 can have an amplitude of approximately −1.5 V to approximately −2.0 V.

Pulse 532 can be referred to as a programming pulse 532. As an example, pulse 532 can be a reset programming pulse (e.g., a pulse used to program a cell from a low resistance set state to one of a number of higher resistance states between the set state and a high resistance reset state).

Programming signal 531 includes pulse 534, which can be referred to as a stabilization pulse 534. In the embodiment illustrated in FIG. 5, stabilization pulse 534 is applied to the selected resistive memory cell immediately after programming pulse 532 is applied to the cell. That is, programming pulse 532 and stabilization pulse 534 can be applied to the selected resistive memory cell as a combined pulse.

As shown in FIG. 5, the polarity of stabilization pulse 534 is opposite the polarity of programming pulse 532 (e.g., stabilization pulse 534 is a positive pulse). As an example, stabilization pulse 534 can have an amplitude of approximately 1.4 V and a duration of approximately 1.0 μs, as illustrated in FIG. 5. That is, stabilization pulse 534 can have a smaller amplitude than and/or the same duration as programming pulse 532. However, embodiments of the present disclosure are not limited to a particular amplitude or duration for stabilization pulse 534. In a number of embodiments, the amplitude and duration of stabilization pulse 534 can depend on factors such as the type of resistive memory cell, among other factors. As an example, in a number of embodiments, the amplitude of stabilization pulse 534 can be increased as the duration of stabilization pulse 534 is decreased, and vice versa.

Applying stabilization pulse 534 to the selected resistive memory cell can provide stabilization of the programmed resistance state of the cell, in a manner analogous to that previously described in connection with FIG. 3.

In a number of embodiments, signal 531 can include a program verify pulse (not shown in FIG. 5) used to determine whether the selected resistive memory cell has reached the target state. If not, a subsequent programming pulse and/or stabilization pulse can be applied to the selected resistive memory cell, followed by another program verify pulse, until the cell reaches the target state.

Although voltage pulses are shown in FIG. 5, embodiments of the present disclosure are not so limited. For example, programming signal 531 could include current pulses.

Figure 6:
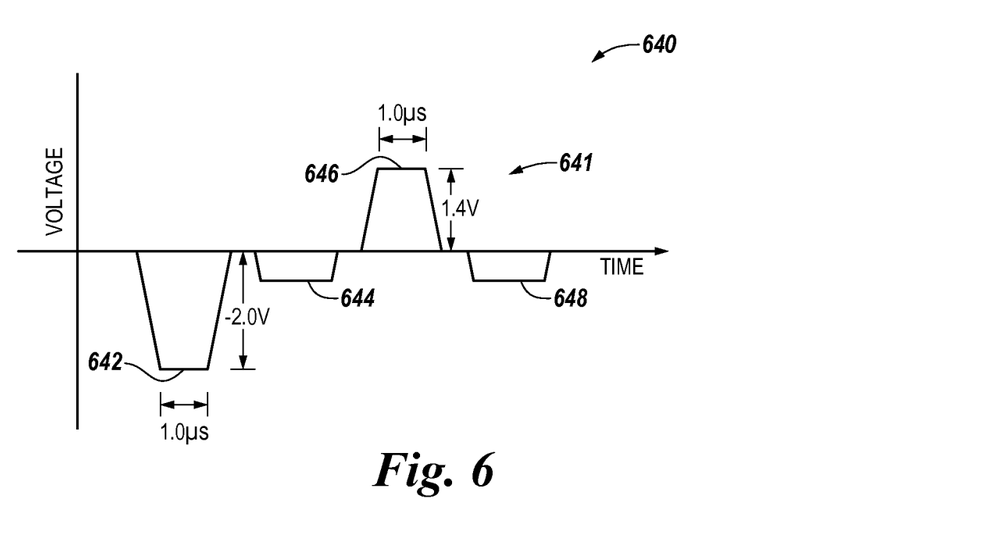
FIG. 6 illustrates a timing diagram associated with operating resistive memory cells in accordance with one or more embodiments of the present disclosure.

FIG. 6 illustrates a timing diagram 640 associated with operating resistive memory cells in accordance with one or more embodiments of the present disclosure. Timing diagram 640 includes a programming signal 641. In this example, programming signal 641 includes pulses 642, 644, 646, and 648. As an example, programming signal 641 can be used in association with programming resistive memory cells such as resistive memory cells 106 of array 100 previously described in connection with FIG. 1.

Programming pulses 642, 644, 646, and 648 can be applied to a selected resistive memory cell in order to program the cell to a resistance state corresponding to a target data state. In this example, pulse 642 of signal 641 can be analogous to programming pulse 532 previously described in connection with FIG. 5.

Programming signal 641 includes pulse 644, which can be referred to as a program verify pulse 644. In the embodiment illustrated in FIG. 6, program verify pulse 644 is applied to the selected resistive memory cell after programming pulse 642 is applied to the cell.

As shown in FIG. 6, as an example, program verify pulse 644 can have a smaller amplitude and/or a longer duration than programming pulse 642. However, embodiments of the present disclosure are not limited to a particular amplitude or duration for program verify pulse 644.

Program verify pulse 644 can be used to determine whether the selected resistive memory cell has reached the target state. If not, a subsequent programming pulse can be applied to the selected resistive memory cell, and followed by another program verify pulse, until the cell reaches the target state.

Programming signal 641 includes pulse 646, which can be referred to as a stabilization pulse 646. In the embodiment illustrated in FIG. 6, stabilization pulse 646 is applied to the selected resistive memory cell after program verify pulse 644 is applied to the cell. That is, programming pulse 642 and stabilization pulse 646 can be applied to the selected resistive memory cell as separate pulses.

Stabilization pulse 646 can be analogous to stabilization pulse 534 previously described in connection with FIG. 5. Applying stabilization pulse 646 to the selected resistive memory cell can provide stabilization of the programmed resistance state of the cell, in a manner analogous to that previously described in connection with FIG. 3.

Programming signal 641 includes pulse 648, which can be referred to as a program verify pulse 648. In the embodiment illustrated in FIG. 6, program verify pulse 648 is applied to the selected resistive memory cell after stabilization pulse 646 is applied to the cell.

As shown in FIG. 6, the polarity of program verify pulse 648 is the same as the polarity of program verify pulse 644 (e.g., program verify pulse 648 is a negative pulse). As an example, program verify pulse 648 can have a smaller amplitude and/or a longer duration than programming pulse 642, as illustrated in FIG. 6 (e.g., program verify pulse 648 can have the same amplitude and/or duration as program verify pulse 644). However, embodiments of the present disclosure are not limited to a particular amplitude or duration for program verify pulse 648.

Program verify pulse 648 can be used to determine whether the selected resistive memory cell has remained in the target state. For example, program verify pulse 648 can be used to determine whether the resistance state of the cell has switched from the target resistance state (e.g., from a high resistance state to a low resistance state).

If the selected resistive memory cell has not remained in the target state (e.g., if the resistance state of the cell has switched from a high state to a low state), the programmed resistance state of the cell may not be stabilized. In such instances, an additional programming pulse and an additional stabilization pulse can be applied to the cell (e.g., after program verify pulse 648 is applied to the cell) to program and stabilize the cell again. The polarity of the additional stabilization pulse (not shown in FIG. 6) can be the same as the polarity of stabilization pulse 646 (e.g., the additional stabilization pulse can be a positive pulse). As an example, the additional stabilization pulse can have a different amplitude and/or a different duration than stabilization pulse 646.

If the selected resistive memory cell has remained in the target state (e.g., if the resistance state of the cell has not switched), the programmed resistance state of the cell may be stabilized. In such instances, it may be unnecessary to apply an additional stabilization pulse to the cell (e.g., no additional stabilization pulse may be applied to the cell).

Although voltage pulses are shown in FIG. 6, embodiments of the present disclosure are not so limited. For example, programming signal 641 could include current pulses.

Figure 7:
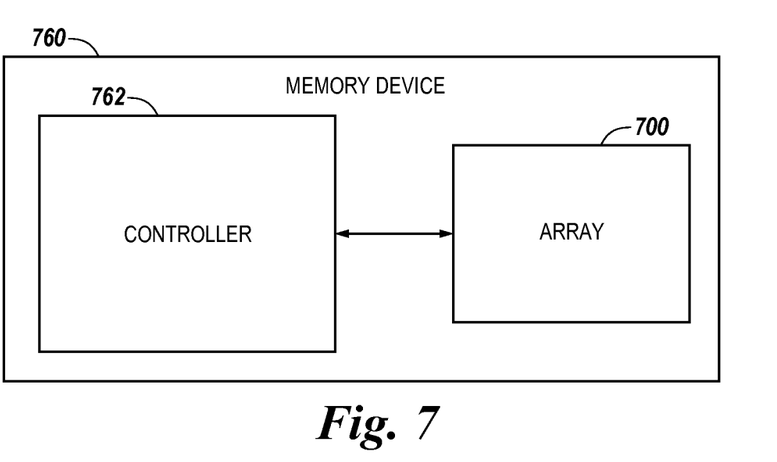
FIG. 7 illustrates a block diagram an apparatus in the form of a memory device in accordance with one or more embodiments of the present disclosure.

FIG. 7 illustrates a block diagram of an apparatus in the form of a memory device 760 in accordance with one or more embodiments of the present disclosure. As shown in FIG. 7, memory device 760 includes a memory array 700 and a controller 762 coupled to memory array 700.

Memory array 700 can be, for example, memory array 100 previously described in connection with FIG. 1. Although one memory array is shown in FIG. 7, embodiments of the present disclosure are not so limited (e.g., memory device 760 can include more than one memory array coupled to controller 762).

Controller 762 can include, for example, control circuitry and/or firmware. Controller 762 can be included on the same physical device (e.g., the same die) as memory array 700, or can be included on a separate physical device that is communicatively coupled to the physical device that includes memory array 700.

Controller 762 can apply a number of pulses in accordance with one or more embodiments of the present disclosure to the memory cells in memory array 700. For example, controller 762 can apply the programming, stabilization, and/or program verify pulses previously described in connection with FIGS. 3, 4, 5, and/or 6 to the memory cells in memory array 700.

The embodiment illustrated in FIG. 7 can include additional circuitry that is not illustrated so as not to obscure embodiments of the present disclosure. For example, memory device 760 can include address circuitry to latch address signals provided over I/O connectors through I/O circuitry. Address signals can be received and decoded by a row decoder and a column decoder, to access memory array 700. It will be appreciated by those skilled in the art that the number of address input connectors can depend on the density and architecture of memory device 760 and/or memory array 700.

CONCLUSION

The present disclosure includes apparatuses and methods including stabilization of resistive memory. A number of embodiments include applying a programming signal to a resistive memory cell, wherein the programming signal includes a first portion having a first polarity and a second portion having a second polarity, wherein the second polarity is opposite the first polarity.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of operating a resistive memory cell, comprising:
applying a programming signal to the resistive memory cell;
wherein the programming signal includes a first portion having a first polarity and a second portion having a second polarity, wherein the second polarity is opposite the first polarity.

2. The method of claim 1, wherein a duration of the first portion is shorter than a duration of the second portion.

3. The method of claim 1, wherein the first portion includes a programming pulse and the second portion includes a stabilization pulse.

4. The method of claim 3, wherein the stabilization pulse is configured to induce stabilization associated with a target data state of the resistive memory cell.

5. The method of claim 3, wherein an amplitude of the programming pulse is greater than an amplitude of the stabilization pulse.

6. The method of claim 1, wherein the programming signal includes a program verify pulse between the first portion and the second portion.

7. The method of claim 1, wherein the first polarity is positive.

8. The method of claim 1, wherein the first polarity is negative.

9. An apparatus, comprising:
an array of resistive memory cells; and
a controller coupled to the array configured to:
apply a programming pulse having a first polarity to a selected memory cell of the array; and
apply a stabilization pulse having a second polarity to the selected memory cell immediately after applying the programming pulse to the selected memory cell, wherein the second polarity is opposite the first polarity.

10. The apparatus of claim 9, wherein the programming pulse is a set pulse.

11. The apparatus of claim 9, wherein the programming pulse is a reset pulse.

12. The apparatus of claim 9, wherein the stabilization pulse has a smaller amplitude than the programming pulse.

13. The apparatus of claim 9, wherein the stabilization pulse has a longer duration than the programming pulse.

14. A method of operating a resistive random access memory (RRAM) cell, comprising:
applying a programming pulse having a first polarity to the RRAM cell to program the RRAM cell to a target resistance state;
applying a program verify pulse to the RRAM cell after applying the programming pulse to the RRAM cell; and
applying a stabilization pulse having a second polarity to the RRAM cell after applying the program verify pulse to the RRAM cell, wherein the second polarity is opposite the first polarity.

15. The method of claim 14, wherein:
the first polarity is a positive polarity; and
the second polarity is a negative polarity.

16. The method of claim 14, wherein:
the first polarity is a negative polarity; and
the second polarity is a positive polarity.

17. The method of claim 14, wherein the method includes applying an additional program verify pulse to the RRAM cell after applying the stabilization pulse to the RRAM cell to determine whether a resistance state of the RRAM cell is the target resistance state.

18. The method of claim 17, wherein the method includes applying an additional programming pulse having the first polarity and an additional stabilization pulse having the second polarity to the RRAM cell after applying the additional program verify pulse to the RRAM cell if the resistance state of the RRAM cell is not the target resistance state.

19. The method of claim 18, wherein the additional stabilization pulse has a different amplitude and/or a different duration than the stabilization pulse.

20. An apparatus, comprising:
an array of resistive memory cells; and
a controller configured to:
apply a negative programming pulse to a selected cell of the array; and
apply a positive stabilization pulse to the selected cell after applying the negative programming pulse to the selected cell.

21. An apparatus, comprising:
an array of resistive memory cells; and
a controller configured to:
apply a positive programming pulse to a selected memory cell of the array; and
apply a negative stabilization pulse to the selected cell after applying the positive programming pulse to the selected cell.

22. The apparatus of claim 21, wherein the controller is configured to apply the positive programming pulse and the negative stabilization pulse to the selected cell as a combined pulse.

23. The apparatus of claim 21, wherein the controller is configured to apply a positive program verify voltage to the selected cell after applying the positive programming pulse to the selected cell and before applying the negative stabilization pulse to the selected cell.

24. The apparatus of claim 21, wherein the positive programming pulse is a set programming pulse.

25. The apparatus of claim 21, wherein the selected cell is a multilevel resistive random access memory cell.

26. A method of operating a resistive random access memory (RRAM) cell, comprising:
applying a negative programming pulse to the RRAM cell; and
applying a positive stabilization pulse to the RRAM cell after applying the negative programming pulse to the RRAM cell.

27. The method of claim 26, wherein the method includes applying the negative programming pulse and the positive stabilization pulse to the RRAM cell as a combined pulse.

28. The method of claim 26, wherein the method includes applying a negative program verify voltage to the RRAM cell after applying the negative programming pulse to the RRAM cell and before applying the positive stabilization pulse to the RRAM cell.

29. The method of claim 26, wherein the negative programming pulse is a reset programming pulse.

30. A method of programming a resistive memory cell, comprising:
applying a number of programming pulses to the resistive memory cell;
applying a program verify pulse to the resistive memory cell between each of the number of programming pulses; and
applying a stabilization pulse having a polarity opposite that of the number of programming pulses to the resistive memory cell;
wherein the stabilization pulse is applied after each of the number of programming pulses and a corresponding program verify pulse.

31. A method of programming a resistive memory cell to a target state, comprising:
applying a number of programming pulses to the resistive memory cell;
applying a program verify pulse to the resistive memory cell after each of the number of programming pulses until the resistive memory cell is determined to have reached the target state; and
applying a stabilization pulse to the resistive memory cell subsequent to the cell reaching the target state;
wherein the stabilization pulse is opposite in polarity to the number of programming pulses.

32. The method of claim 31, wherein the method includes applying another program verify pulse to the resistive memory cell subsequent to applying the stabilization pulse.

* * * * *